US011871543B2

(12) United States Patent
Har-Shai et al.

(10) Patent No.: US 11,871,543 B2
(45) Date of Patent: Jan. 9, 2024

(54) COOLING MECHANISM FOR MULTI-COMPARTMENT POWER DEVICE

(71) Applicant: Solaredge Technologies Ltd., Herzeliya (IL)

(72) Inventors: Liron Har-Shai, Tel Mond (IL); Vyacheslav Gak, Ramat Gan (IL); Tal Eliya, Tiberias (IL); Igor Morozov, Kfar-Yona (IL)

(73) Assignee: Solaredge Technologies Ltd., Herzeliya (IL)

(*) Notice: Subject to any disclaimer, the term of this patent is extended or adjusted under 35 U.S.C. 154(b) by 5 days.

(21) Appl. No.: 17/363,925

(22) Filed: Jun. 30, 2021

(65) Prior Publication Data

US 2021/0410333 A1    Dec. 30, 2021

Related U.S. Application Data

(60) Provisional application No. 63/045,940, filed on Jun. 30, 2020.

(51) Int. Cl.
  *H05K 7/20* (2006.01)
  *H01F 27/08* (2006.01)

(52) U.S. Cl.
  CPC ......... *H05K 7/20418* (2013.01); *H01F 27/08* (2013.01); *H05K 7/209* (2013.01)

(58) Field of Classification Search
  CPC ..... H05K 7/20418; H05K 7/209; H01F 27/08
  USPC ....................................................... 361/714
  See application file for complete search history.

(56) References Cited

U.S. PATENT DOCUMENTS

| | | | | |
|---|---|---|---|---|
| 3,713,060 A * | 1/1973 | Harlow | ................. | H01F 27/12 174/15.1 |
| 4,177,499 A * | 12/1979 | Volkmann | ............. | H05K 7/209 361/710 |
| 5,091,823 A * | 2/1992 | Kanbara | ............ | H05K 7/20927 361/736 |
| 5,291,064 A * | 3/1994 | Kurokawa | ............ | H01L 23/473 257/E23.098 |
| 5,396,403 A * | 3/1995 | Patel | ..................... | H01L 23/433 257/713 |
| 5,430,611 A * | 7/1995 | Patel | ..................... | H01L 23/467 257/E23.09 |
| 5,583,385 A * | 12/1996 | Horie | ..................... | B60L 9/00 307/151 |
| 5,724,729 A * | 3/1998 | Sherif | ................. | H01L 23/3737 361/705 |

(Continued)

FOREIGN PATENT DOCUMENTS

KR        20180080927 A       7/2018

OTHER PUBLICATIONS

Dec. 6, 2021—European Search Report—EP App. No. 21182041.0.

*Primary Examiner* — Anatoly Vortman
(74) *Attorney, Agent, or Firm* — Banner & Witcoff, Ltd.

(57) ABSTRACT

Inverters for direct current (DC) to alternating current (AC) conversion may comprise switching elements which produce harmonic overtones. Inductive elements may be added into the inverters, such as to attenuate effects of harmonic overtones. Methods and systems for a casing suitable for reduced potting over its inductive elements is described. One or more heat dispersing elements may be disposed in the casing. Related systems and methods are also described.

20 Claims, 10 Drawing Sheets

(56) References Cited

U.S. PATENT DOCUMENTS

| | | | |
|---|---|---|---|
| 5,927,386 A * | 7/1999 | Lin | G11B 33/1426 165/185 |
| 5,981,310 A * | 11/1999 | DiGiacomo | H01L 23/433 257/E23.09 |
| 6,065,530 A * | 5/2000 | Austin | H05K 9/0049 174/16.3 |
| 6,082,443 A * | 7/2000 | Yamamoto | F28D 15/046 174/15.2 |
| 6,269,866 B1 * | 8/2001 | Yamamoto | F28D 15/0233 174/15.2 |
| 6,365,964 B1 * | 4/2002 | Koors | H05K 7/20436 257/713 |
| 6,650,559 B1 * | 11/2003 | Okamoto | H01L 25/162 363/141 |
| 6,821,816 B1 * | 11/2004 | Lawlyes | H01L 23/433 257/E23.09 |
| 6,906,483 B2 * | 6/2005 | Tominaga | B62D 5/0406 361/752 |
| 7,023,699 B2 * | 4/2006 | Glovatsky | H05K 7/20454 361/708 |
| 7,038,910 B1 * | 5/2006 | Hodge | H05K 7/20445 361/752 |
| 8,240,411 B2 * | 8/2012 | Nakatsu | B60L 50/00 361/689 |
| 9,901,009 B2 * | 2/2018 | Sugita | H05K 7/205 |
| 10,383,253 B1 * | 8/2019 | Mujcinovic | H05K 7/20409 |
| 10,542,640 B1 * | 1/2020 | Leigh | H05K 7/20772 |
| 2003/0123203 A1 * | 7/2003 | Telefus | H02H 9/005 361/58 |
| 2004/0264114 A1 * | 12/2004 | Hachiya | H05K 1/0203 361/676 |
| 2010/0079230 A1 * | 4/2010 | Brubaker | H01F 41/005 29/605 |
| 2016/0203907 A1 * | 7/2016 | Handy | H01F 27/266 29/605 |
| 2017/0273218 A1 * | 9/2017 | Stoermer | H01L 23/3675 |
| 2021/0136948 A1 * | 5/2021 | Tanaka | H05K 1/0203 |
| 2021/0410333 A1 * | 12/2021 | Har-Shai | H05K 7/209 |

\* cited by examiner

COOLING MECHANISM FOR MULTI-COMPARTMENT POWER DEVICE

CROSS-REFERENCE TO RELATED APPLICATIONS

The present application claims priority to U.S. Provisional Patent Application No. 63/045,940, filed Jun. 30, 2020. The contents of the above identified application are incorporated herein by reference in its entirety.

BACKGROUND

An electronic assembly may be filled, partially or completely, with a solid or gelatinous compound. Such a filling, or 'potting', may provide increased heat conductance, resistance to shock and vibration, exclusion of gaseous phenomena such as corona discharge, or protection from environmental elements such as water or potentially corrosive chemicals. Thermosetting plastics, silicone rubber gels, or epoxy resins are often used as potting materials.

Potting often entails placing an electronic assembly inside a mold (the 'pot') which is then filled with a liquid potting substance which then hardens as it dries, thereby providing a measure of long term protection to the assembly. The pot may remain with the assembly or not, depending on particular product requirements.

A disadvantage of the potting process is the cost and weight of the potting compound. When manufacturing large numbers of units which require potting, each individual unit may require large quantities of potting compound. Multiplying by a large number of mass produced units may quickly turn the potting compound into a major expense in the manufacturing process, as well as a major factor in the final weight of the product including the potted unit.

SUMMARY

The following summary presents a simplified summary of certain features. The summary is not an extensive overview and is not intended to identify key or critical elements.

A casing having a first heat dispersing element disposed superficially on an external surface of the casing is described. The casing may have a hollow space formed by an internal surface of the casing. At least one thermal pad may be disposed in the hollow space. At least one holder may be disposed in the hollow space. At least one inductive element may be placed in the holder, the at least one inductive element disposed to be held by the holder such that the at least one inductive element is held over the at least one thermal pad.

The casing may be configured to be disposed in and/or mechanically connected to a superstructure. The superstructure may comprise a second heat dispersing element disposed superficially on an external surface of the superstructure.

The first heat dispersing element may comprise fins. The second heat dispersing element also may comprise fins. The at least one holder may be made of an electrically isolating material, for example, plastic. The inductive element may comprise, for example, an inductor coil, a choke, a reactor, a transformer.

The superstructure may comprise a casing of a direct current (DC)-to-alternating current (AC) inverter mechanism. The superstructure may comprise a casing of an AC to DC power converter. The superstructure may comprise a casing of a DC-to-DC converter.

An apparatus which does not have potting over its inductive elements is described, as well as methods for constructing such the apparatus. An apparatus which does not have potting over heat generating elements is described, as well as methods for constructing such the apparatus. An apparatus which does not have potting over electrical conducting elements is described, as well as methods for constructing such the apparatus.

These and other features and advantages are described in greater detail below.

BRIEF DESCRIPTION OF THE DRAWINGS

Some features are shown by way of example, and not by limitation, in the accompanying drawings. In the drawings, like numerals reference similar elements.

DETAILED DESCRIPTION

Figure 1:
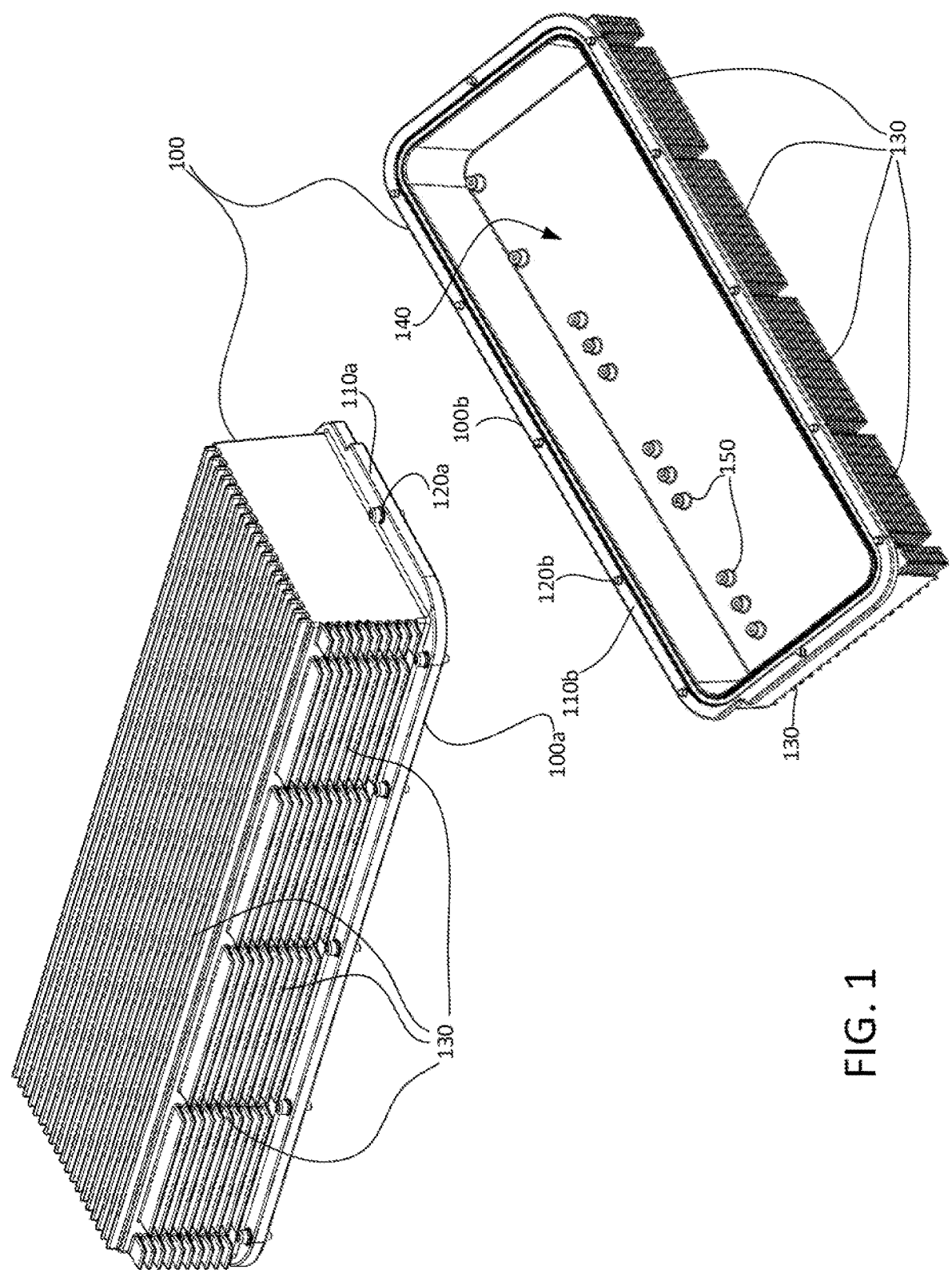
FIG. 1 shows a first view and a second view of a casing.

The accompanying drawings, which form a part hereof, show examples of the disclosure. It is to be understood that the examples shown in the drawings and/or discussed herein are non-exclusive and that there are other examples of how the disclosure may be practiced.

Reference is now made to FIG. 1, which shows a first view 100a and a second view 100b of a casing 100. The casing 100 may be for use, for example, inside and/or attached to a power converter, for example, a direct current (DC) to alternating current (AC) power converter, an AC to DC power converter, or a DC-to-DC power converter. The first view 100A may generally be considered an "external" view of the casing 100, and the second view 100b may generally be considered an "internal" view of the casing 100. The first view 100a may be referred to below, in a non-limiting fashion, as "the external view" of the casing 100a. The second view 100b may be referred to below, in a non-limiting fashion, as "the internal view" of the casing 100a. The same or a similar element may be depicted in one or the other of the external view 100a and the internal view 100b. In such cases, the element's reference number will often be provided with the suffix "a" in the case of the external view 100a, and the suffix "b" in the case of the internal view 100b. In cases where the external view 100a and the internal view 100b of a particular element does not substantially differ, then no distinction will be noted with the use of the suffix.

The casing 100 may comprise a lip 110a and/or a lip 110b. The lip 110a or 110b may comprise respective holes 120a or 120b through which fastening elements, for example, bolts, rivets, screws, etc. may be passed, in order to fasten the casing 100 to a superstructure, as described below with reference to FIGS. 5-7.

The casing 100 may comprise a first heat dispersing element 130 disposed superficially on an external surface of the casing 100. The first heat dispersing element 130 may comprise fins. The fins may increase surface area of the casing 100, which may allow for greater exposure of the casing 100 to surrounding air (or other surrounding media). The air may serve as a cooling medium with which heat from the first heat dispersing element 130 may be exchanged.

The casing 100 may comprise an internal portion 140. The internal portion 140 may provide a hollow space, which may be formed by an internal surface of the casing 100. Various elements and/or apparatus to be described below may be placed or fitted in the internal portion 140 of the casing 100. The internal portion 140 may comprise spacers 150, into which fastening elements may be affixed for holding various apparatus in place in the internal portion 140, as may be described below.

Figure 2:
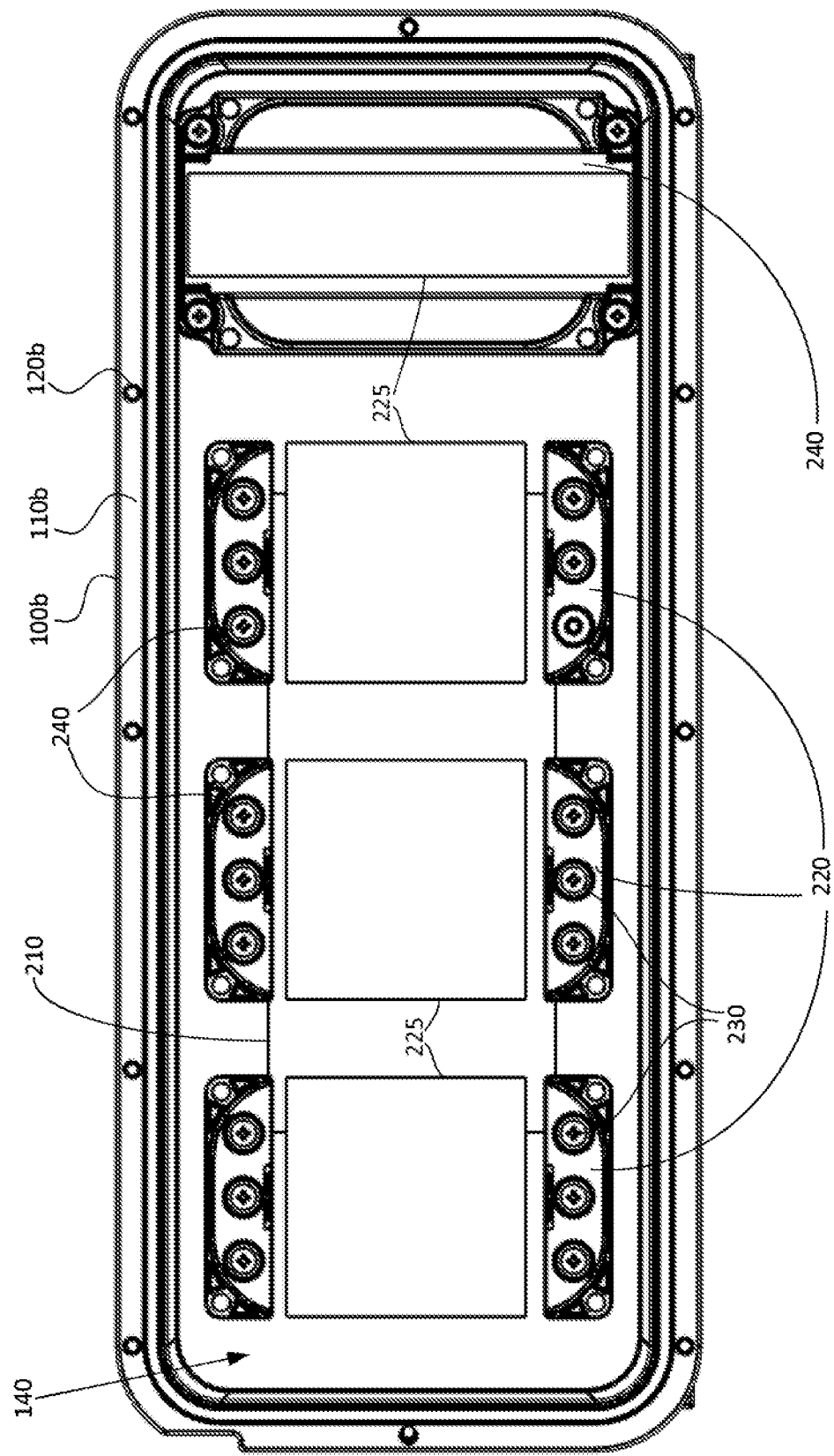
FIG. 2 shows a view of part of a casing.

Reference is now made to FIG. 2, which shows a detail of the second view 100b of the casing 100. The detail of the second view 100b of the casing 100 is showing insulating padding 210 and holders 220. The insulating padding 210, which may comprise an electrically and/or thermally insulating barrier (for example, Nomex® or Kapton®), may be disposed on an internal surface of the casing 100, or a portion of the internal surface of the casing 100. The insulating padding 210 may be disposed next to or near heat generating elements which are placed in the casing 100, as may be described below. A thermal pad 225 may be disposed at the base of one or more holders 220. The thermal pads may be made of a material including paraffin wax or silicone, and may generally conduct heat into a heat dispersing element (e.g., the first heat dispersing element 130, which may be disposed on the opposing side of the casing 100, as may be described above regarding FIG. 1).

It is appreciated that, due to the heat which may be generated inside the internal portion 140 during operation, it may be desirable to shed heat while also providing electrical insulation between the casing 100 and the elements disposed in the internal portion 140. This may be beneficial in the event that the internal portion 140 contains elements which conduct electricity. Thus, the actual insulating padding 210 chosen may be selected in order to provide a high degree of electrical insulation while providing a low degree of thermal insulation.

The casing 100 may comprise one or more holders 220, which may hold components of a DC-AC inverter which are electrically conductive and heat generating. Although FIG. 2 is described with reference to a DC-AC inverter, it is appreciated that the casing 100 may hold components of a DC-DC converter, an AC-DC converter, or other appropriate electronic and heat generating device. The holders 220 may be constructed of an appropriate plastic material, such as an insulating plastic, which may provide electrical and/or heat insulation. In some instances, fasteners used to couple one or more components, such as screws 230 (note that in order to reduce visual noise in the figure, not all screws 230 may be labeled as such) may be electrically conductive. Fasteners may be any suitable fastener, such as a screw, bolt, thermostatically molded coupling, glue, etc. Holders 220 may be designed to insulate conducted electricity of the screws 230. For example, holders 220 may be constructed of an insulating plastic or other appropriate insulating material. A second holder 240 may optionally be provided in the internal portion 140 of the casing 100, for holding a second type of component. The second type of component may be a heat generating component, an electrically conductive component, both, or neither. At least one non-limiting example of a possible second component will be provided below.

A thermal pad 225 may be placed in each of the holders 220 or holders 240. The thermal pads 225 may aid the conduction of heat away from a heat generating component placed in the holder, as may be described below.

Throughout this disclosure and the accompanying figures, various elements may be depicted in a particular quantity. For example, three holders 220 are depicted in the casing 100, twelve holes 120b are depicted on the lip 110b, one differential choke bloke comprising three chokes (as may be depicted in FIG. 3, element 320) is depicted, and so forth. Such depictions and quantities are by way of example only, and not meant to be limiting. Other appropriate quantities of the various elements depicted may be utilized as a matter of course in actual implementations.

Figure 3:
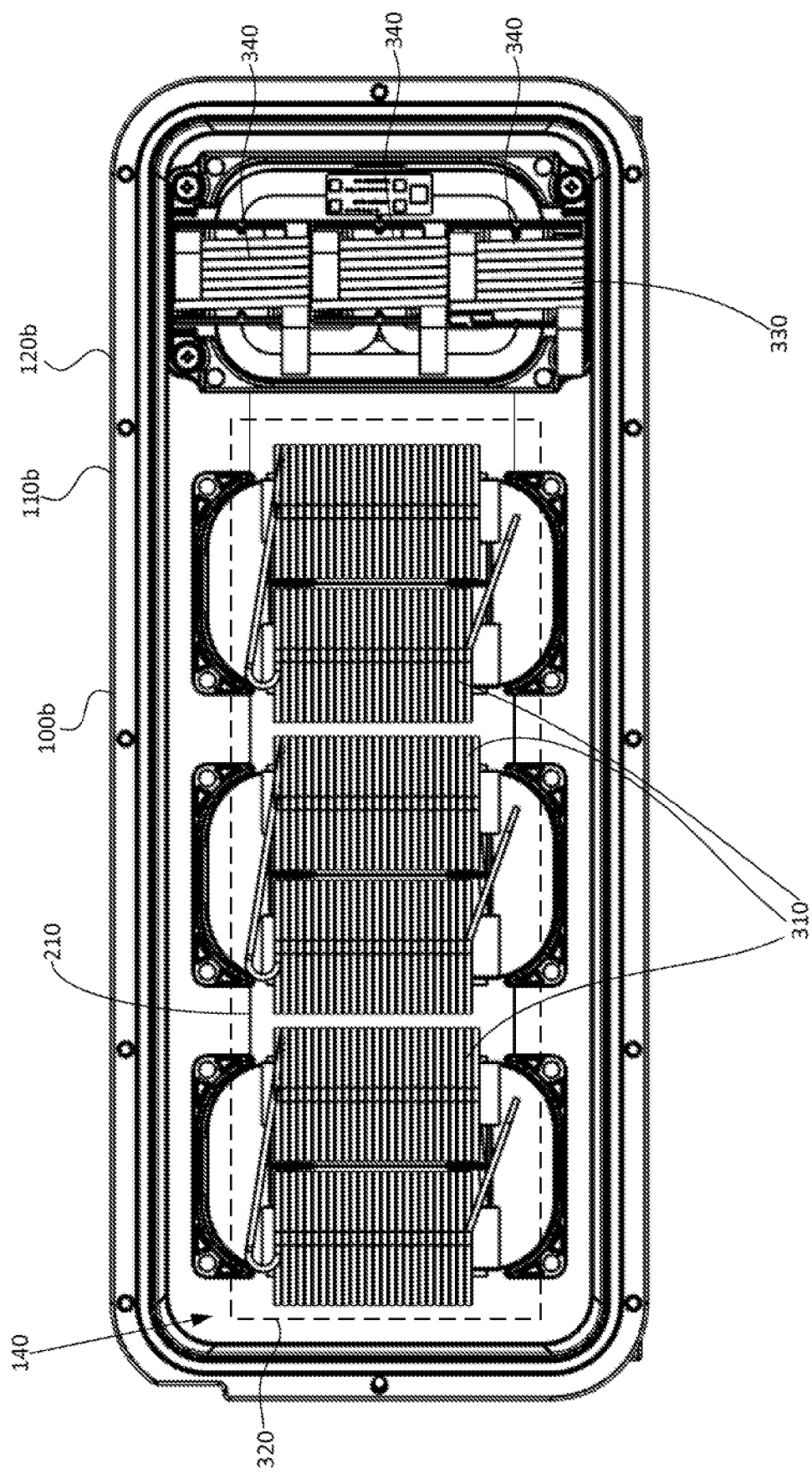
FIG. 3 shows a view of a casing with inductive elements.

Reference is now made to FIG. 3, which may show a view consistent with FIG. 2 with one or more additional aspects. FIG. 3 shows the second view 100b, with inductive elements 310 in the casing 100. Internal portion 140 may form a first chamber configured to hold inductive elements 310. Inductive elements 310 may comprise any appropriate inductive element, such as an inductor, a reactor, a transformer etc. As may be described above, inductive elements 310 may be heat generating and/or electrically conductive inductive elements 310. According to features of the disclosure herein, instead of or in addition to inductive elements, other types of heat generating and/or electrically conductive elements may be disposed in internal portion 140, for example, conducting wires, transistors, resistors, diodes, or other electronic components.

A first group of inductive elements 320 (which may comprise at least one of the inductive elements 310) may be disposed in the casing 100, and may be held by the holders 220. A second group of inductive elements 330 may be disposed in the casing 100, and may be held by the holders 220. The second group of inductive elements 330 may comprise one or more secondary inductive elements 340. It is appreciated that any other appropriate heat generating and/or electrically conductive may be placed in the holders 220, and that the first group of inductive elements 320 and the second group of inductive elements 330 are only one example. In some instances, the first group of inductive elements 320 may include a main choke, and the second group of inductive elements 330 may include a secondary choke, for example, a filter choke (e.g., a common-mode choke and/or a differential choke). In some instances, the first group of inductive elements 320 and the second group of inductive elements 330 may be placed in different holders, such as holder 220. Appropriate concerns of design, space, cost, materials, etc. may affect particular implementations.

It is appreciated that although the above description and accompanying figures are speaking of chokes, choke blocks, inductive elements, etc., any appropriate heat-generating, and/or electrically conductive element may be disposed in the herein described, similar, or equivalent casing.

The various inductive elements 320 or 340 described herein may be held in the holders 220 so as to be disposed in proximity with the insulating padding 210. The insulating padding 210 may be disposed so as to direct heat generated by the at least one of the inductive element 310 and the at least one secondary inductive element 340 to the first heat dispersing element 130. The insulating padding 210 may insulate from electricity, which may be present in the various inductive elements 320 or 340. The screws 230 may be manufactured out of a material which conducts electricity, but may be insulated by surrounding plastics from one or more conductive elements which may surround them.

Cabling (not depicted) from the second group of inductive elements 330 may disposed on one side of the inductive elements 310, and cabling (not depicted) from the first group of inductive elements 320 may be disposed on the other side of the inductive elements 310. This may have the benefit of maintaining a physical separation between the cables from the first group of inductive elements 320 and the cables from the second group of inductive elements 330.

Figure 3A:
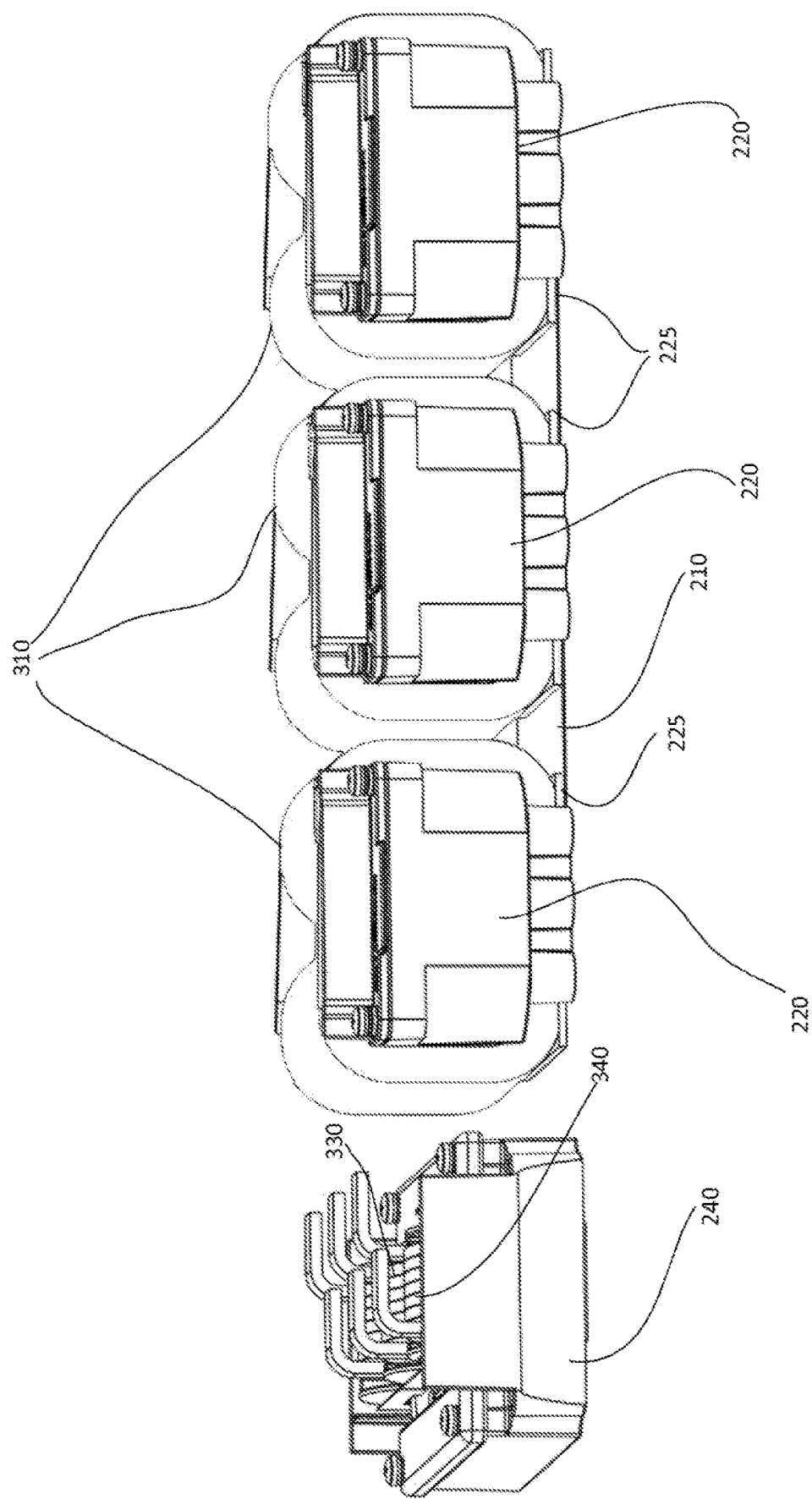
FIG. 3A shows a side view with inductive elements.

FIG. 3A shows a side view of inductive elements 310, such as inductive elements 310 may be depicted in FIG. 3. The insulating padding 210 is seen at the bottom of the figure. A plurality of the thermal pads 225 may be disposed above the insulating padding 210. The holders 220 may be disposed at the sides of the insulating padding 210 and the thermal pads 225. The inductive elements 310 may be disposed in the holders 220, such that each inductive element 310 may be disposed above one of the thermal pads 225. The second group of inductive elements 330 may be disposed in the second holder 240. Insulating padding 210 and thermal pads 225 may also be disposed beneath the second group of inductive elements 330.

Figure 4:
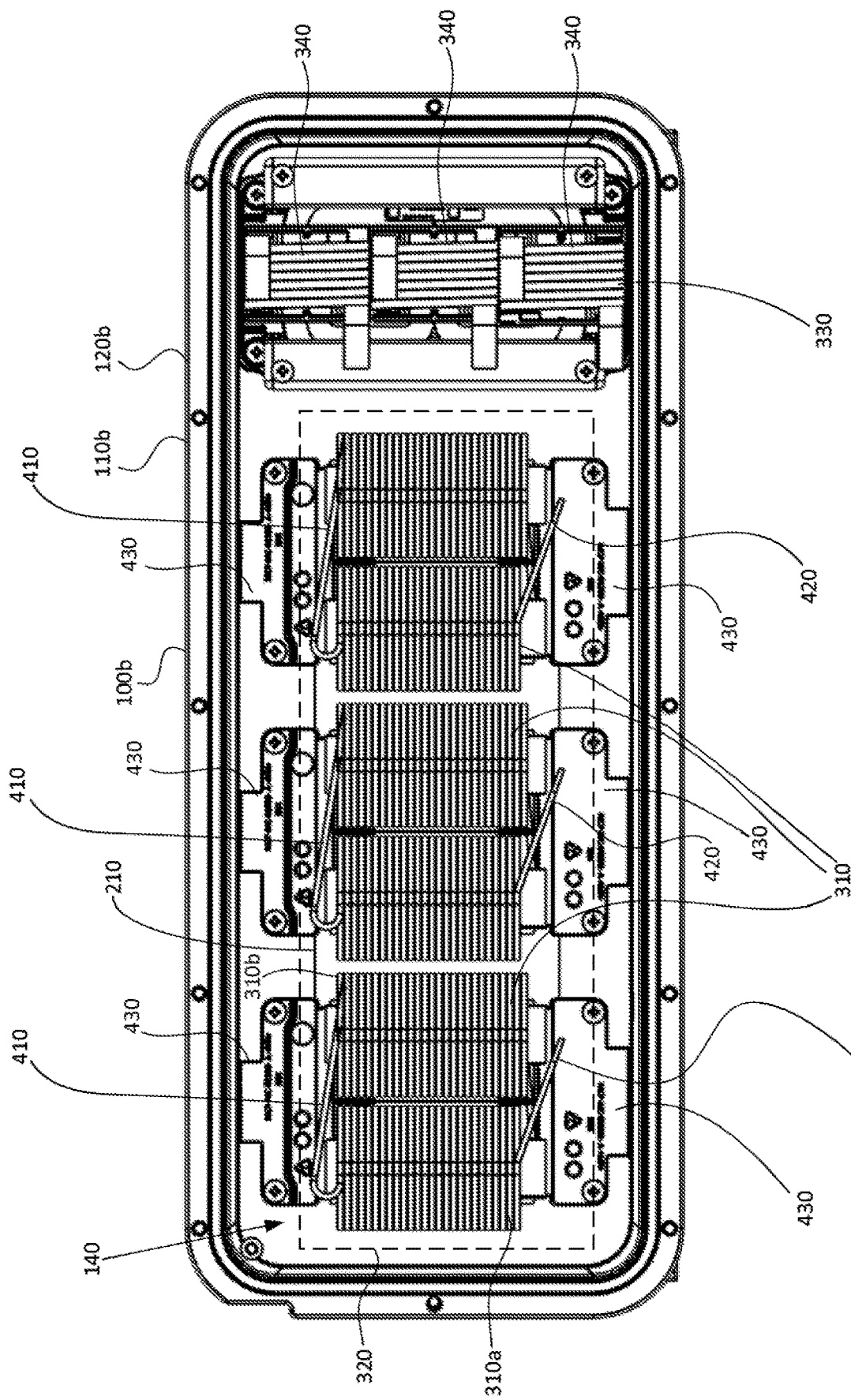
FIG. 4 shows a detail of a casing with supportive extrusions.

Reference is now made to FIG. 4, which may show a view consistent with FIG. 3 with one or more additional aspects, such as supportive extrusions 430. The inductive elements 310 may comprise multiple portions of windings (e.g., first winding portion 310a and second winding portion 310b). Cabling 410 may connect, for example, between first winding portion 310a and second winding portion 310b, and may be supported by extrusions 430. Extrusions 430 may comprise insulating plastic. Similarly, cabling leading to or from a terminal 420 into and/or out of the inductive element 310 may also be supported by extrusions 430.

It is appreciated that the above discussion is showing one possible configuration for the elements depicted as being in the casing 100. The one possible configuration depicted in FIG. 4 is not meant to be limiting, and is by way of example only. For example, as discussed above, there may be different numbers of inductive elements 310 or 340 in the casing 100. Additionally, the first group of inductive elements 320 and the second group of inductive elements 330 may be disposed in different location than shown in the figures. The second group of inductive elements 330 may optionally not be present. The holders 220 or 240 may be in different locations, both with respect to the casing 100 and to each other. The insulating padding 210 may be applied to walls or other internal surfaces of the casing 100. Other examples, for reason of design or implementation may be constructed, despite not being explicitly recited herein (for purposes of brevity).

It is appreciated that the increased thermal dissipation provided by the features described herein may have the benefit of reducing (or eliminating) potting, resins, thermosetting plastics, silicone rubber gels, epoxies, and so forth inside the casing 100. For example, potting might not be applied to any of the elements, such as, the holders 220 or 240, the first group of inductive elements 320, or the second group of inductive elements 330.

Figure 5:
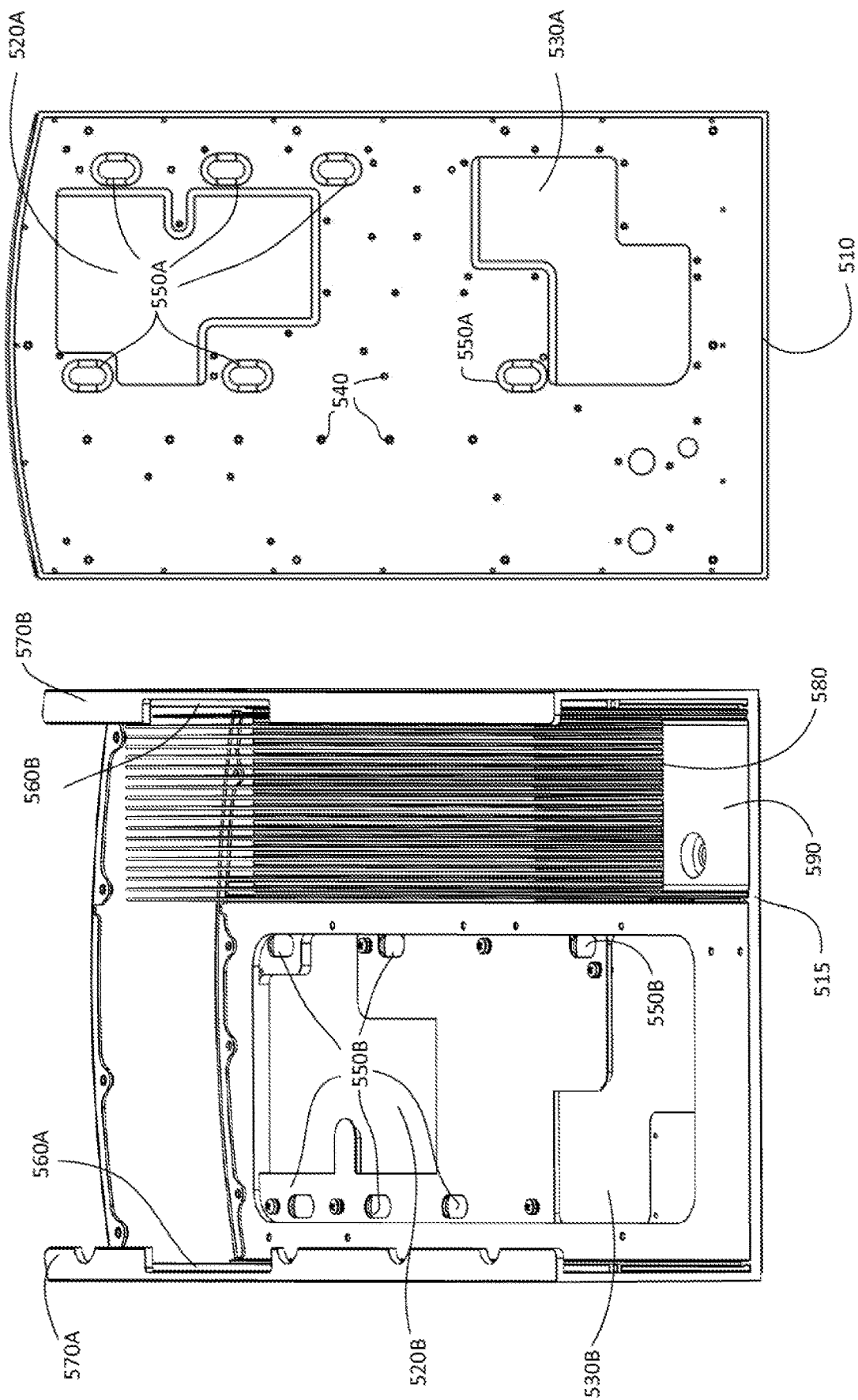
FIG. 5 shows a first covering element and second covering element.

Reference is now made to FIG. 5, which shows a first covering element 510 and second covering element 515 for covering a superstructure. As may be discussed above regarding to FIG. 1, the casing 100 may be fastened or attached in any other appropriate manner to the superstructure. Fastening, attaching and/or sealing the casing 100 to the superstructure may provide shielding against water, dust, moisture, and so forth (which might otherwise seep into an internal portion of the casing 100 through a seam formed between the casing 100 and the superstructure). FIGS. 5-8 may describe the structural relationship between the casing 100 and the superstructure. The first covering element 510 may be placed over the casing, covering the internal portion 140. The first covering element 510 may have first hole 520A and/or a second hole 530A. The first covering element 510 may also have additional holes, such as holes 550A. Holes 550A may be present in the first covering element 510 in order to provide a passage for cabling to pass through. Other holes 540 may be present so that fasteners, such as the kind of fasteners described above, may fasten the first covering element 510 to the casing 100 (or to other parts of the superstructure). The holes 540 may also be used to fasten a circuit board, such as a printed circuit board (not depicted) inside the superstructure. Note that not all such holes which are depicted in FIG. 5 are labeled in the figure in order to reduce visual noise.

The first covering element 510 may be covering the internal portion 140, and the first hole 520A may be generally disposed so as to be over the first group of inductive elements 320. The first covering element 510 may be covering the internal portion 140, and the second hole 530A may be generally situated so as to be over the second group of inductive elements 330. The first hole 520A and the second hole 530A may optionally be present in the design of the first covering element 510. The first covering element 510 may be fully closed (e.g., except for the holes 520A, 530A and/or 550A, such as for passing cabling through the first covering element 510). The first hole 520A or the second hole 530A may be created in the first covering element 510, and may be relatively large, in order to reduce material used in the first covering element 510, to reduce the weight of the first covering element 510 and/or to provide easy passage of multiple cables. In some cases, first hole 520A and/or second hole 530A may designed to be small (e.g., similar to the size of holes 550A, designed to provide a passage for few cables or even a single cable).

The second covering element 515 may be placed in contact the first covering element 510, such that the first hole 520A in the first covering element 510 may be generally aligned with the third hole 520B in the second the covering element 515. The second hole 530A in the first covering element 510 may be generally aligned with fourth hole 530B in the second covering element 515. Holes 550B in the second covering element 515 may be generally aligned with holes 550A in the first covering element 510, and may provide a passage for cabling into the superstructure.

The second covering element 515 may comprise a first wall 560A and a second wall 560B which may rise out of the second covering element 515, and may generally assume the form of a flange beam. Flanges 570A and 570B may be used, such as when assembling the superstructure, as support elements.

As may be described below, a second heat dispersing element 580 may be generally disposed on one side of the holes 520B, 530B, or 550B, so as to be generally disposed where the casing 100 is not disposed (e.g., over a second chamber not depicted in FIG. 5). A space or surface 590 may be provided so that a cooling device (e.g., a fan) which may cool the contents of the superstructure and casing 100 may be added to the superstructure.

The first chamber and the second chamber may be connected to one another with a solid wall disposed between them, such as one of the walls of casing 100. In some instances, the wall may not be its full height (e.g., it may be only a fraction of its potential height, such as half height, two thirds height, or one quarter height). In some instances, sections of the wall may be missing (e.g., the wall may be designed to have openings similar to "windows"). In still further aspects, there might not be a wall between the two chambers.

Figure 6:
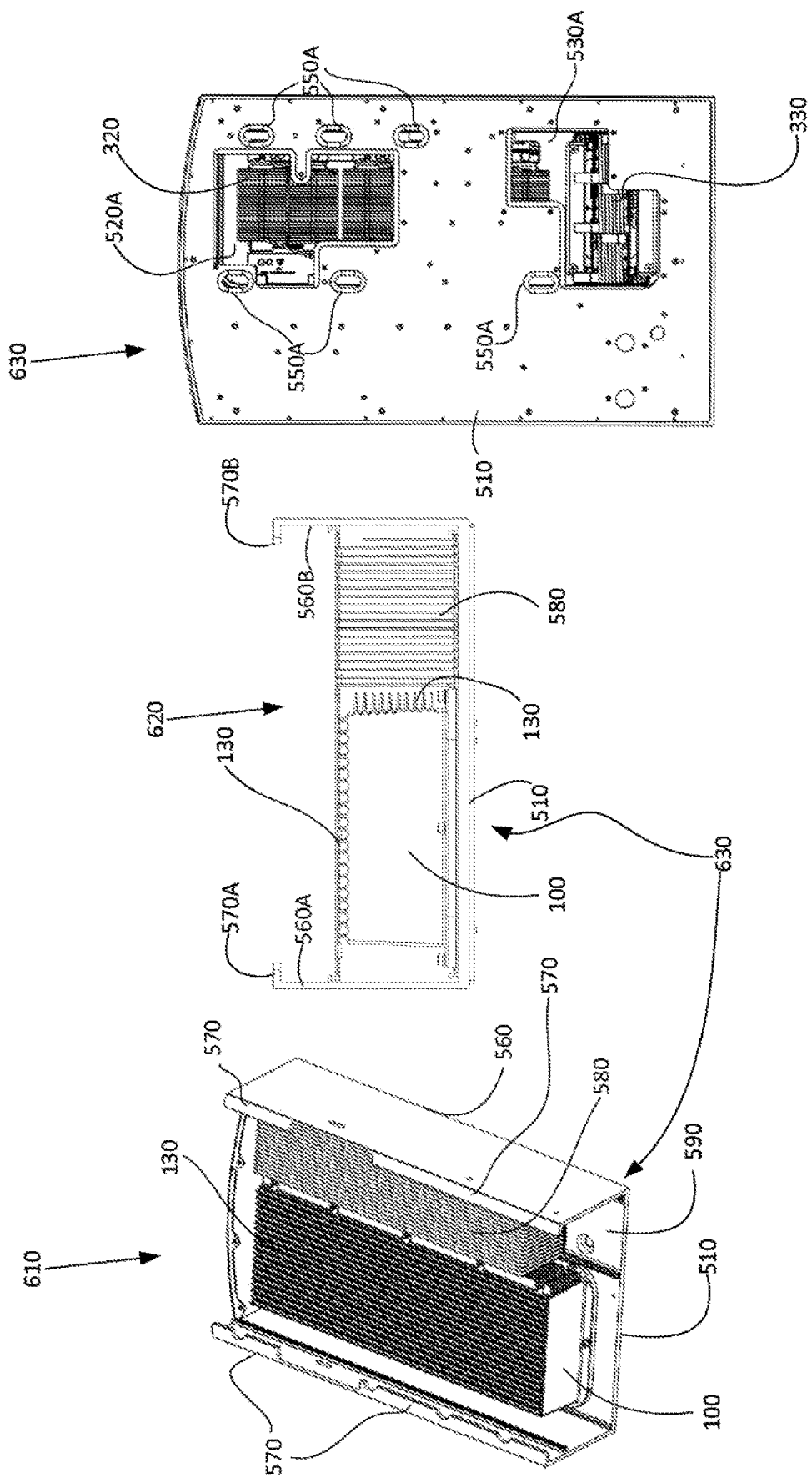
FIG. 6 shows different perspectives of elements of the superstructure.

Reference is now made to FIG. 6, which shows different perspectives of elements of a superstructure. A first perspective 610 may be a view of the superstructure from above. A second perspective 620 may be a view of the superstructure from the side. A third perspective 630 may be a view looking at the superstructure from below. In the first perspective 610, the casing 100 and the first heat dispersing element 130 are both depicted. The first covering element 510 is at the bottom, and may serve as a base for elements displayed in the visible portion of the superstructure in first perspective 610. A wall 560 (which may comprise one side of the first wall 560A and the second wall 560B of FIG. 5) may form at least a portion of one side of the superstructure. Flanges 570 are depicted in the first perspective. A second heat dispersing element 580 may be disposed on one side of the first heat dispersing element 130. A fan, for example, may be affixed to the space or surface 590, for cooling purposes.

The second heat dispersing element 580 may comprise fins or other appropriate passive or active heat dispersing mechanism. Additionally, the first heat dispersing element 130 or the second heat dispersing element 580 may comprise fins of different lengths, widths, or heights. Gaps between the fins of the first heat dispersing element 130 or the second heat dispersing element 580 may be different sizes. The fins, in the first heat dispersing element 130 or the second heat dispersing element 580, may be different lengths, heights or widths. The gap between the fins in the first heat dispersing element 130 or the second heat dispersing element 580 may be different lengths, heights or widths. Other, appropriate non-fin type heat dispersing heat dispersing elements, either active or passive, may be used in design of either or both of the first heat dispersing element 130 or the second heat dispersing element 580. The use of fins in the present disclosure and figures is by way of example only, and not meant in a limiting fashion.

In second perspective 620, the top and sides of the casing 100 is seen, as well as the first heat dispersing element 130, which is superficially attached thereto. The first covering element 510 may serve as a base for elements displayed in the visible portion of the superstructure in second perspective 620. The first wall 560A and a second wall 560B are shown, for exemplary purposes, in their position relative to the other elements depicted in the second perspective 620, as are flanges 570A and 570B.

The third perspective 630 may correspond to the bottom of first perspective 610 or second perspective 620. An arrow (labeled with element number 630) is depicted in the first perspective 610 and in the second perspective 620, and may indicate the general position of what is seen in the third perspective 630. The first covering element 510 is depicted, as are the first hole 520A and the second hole 530A. The first group of inductive elements 320 is depicted through the first hole 520. A portion of the first group of inductive elements 320 and of the second group of inductive elements 330 is depicted through the second hole 530A. Holes 550A are also depicted in the third perspective 630. In some instances, the first heat dispersing element 130 may extend in more than one direction off of the casing 100. Such a disposition of the first heat dispersing element 130 may provide dispersion of heat optimized for a particular design of the casing 100 and/or the superstructure. It is appreciated that in other designs or implementations of the casing 100, the first heat dispersing element 130 may be disposed in a fashion appropriate to a particular design of the casing 100. In some instances, a space is deliberately left between the first heat dispersing element 130 and the second heat dispersing element 580. The space may have the benefit of improving heat dispersion. In some instances (e.g., depending on the amount of anticipated heat to be dispersed by the first heat dispersing element 130 and the second heat dispersing element 580), the first heat dispersing element 130 and the second heat dispersing element 580 may be placed in contact with one another. In some cases, the first heat dispersing element 130 and the second heat dispersing element 580 may be placed in direct contact (e.g., metal-to-metal) with one another, and in some cases, the first heat dispersing element 130 and the second heat dispersing element 580 may be placed in indirect contact (e.g., with a thermal pad inserted between the metallic components) with one another.

Figure 7:
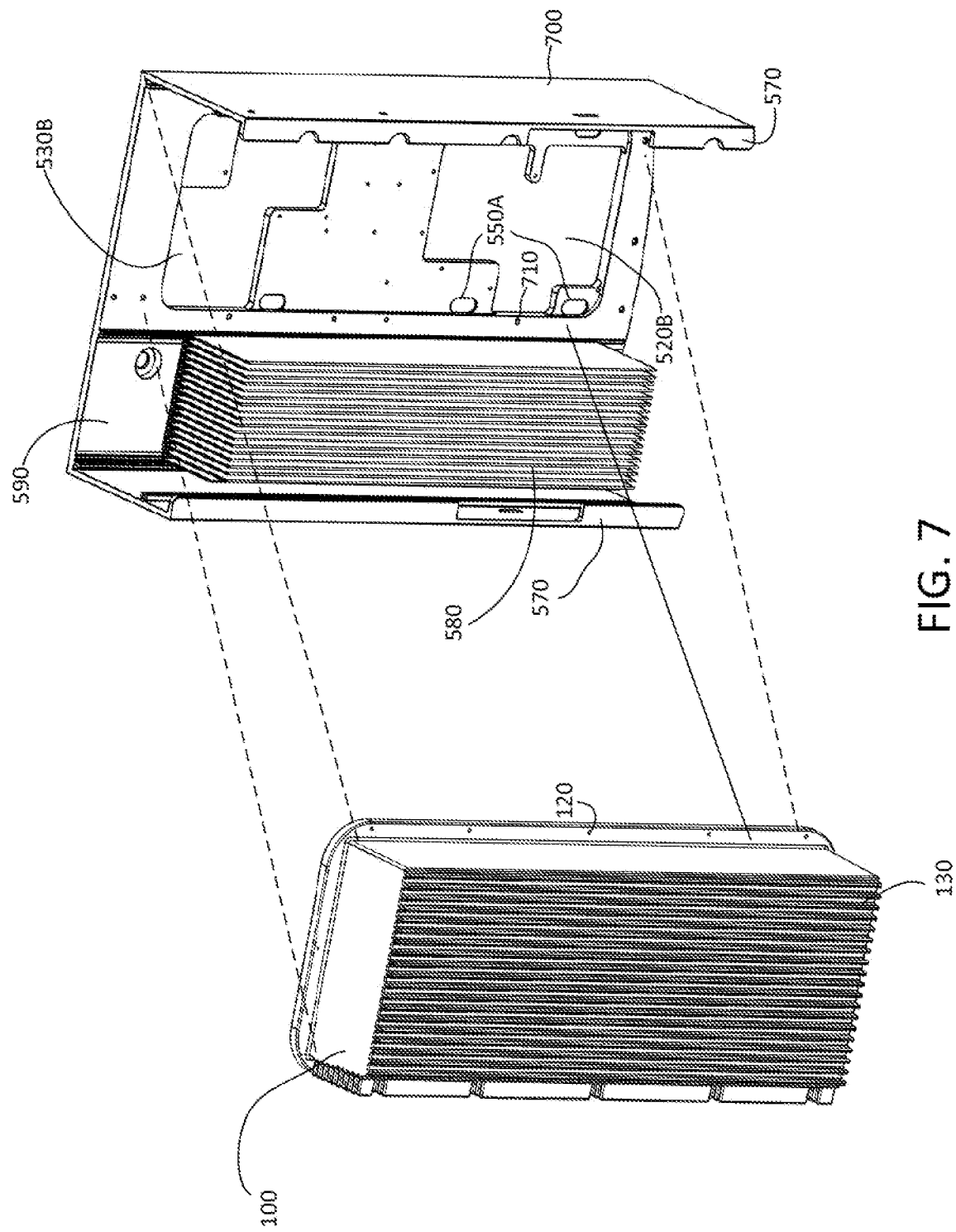
FIG. 7 shows a structural relationship between a casing and a frame which may hold the casing and the superstructure together.

Reference is now made to FIG. 7, which shows a structural relationship between a casing (e.g., casing 100 of FIG. 1) and a frame (e.g., frame 700, which may hold the casing 100 and the superstructure together). The casing 100 may be aligned with the third hole 520B and the fourth hole 530B. Dotted lines in FIG. 7 indicate an exemplary physical alignment and placing of the casing 100 into the frame 700 and, therefore, the superstructure. The frame 700 may be designed as part of the superstructure, or the frame 700 may be a separate element used in assembling the casing 100 and the superstructure together.

Figure 8:
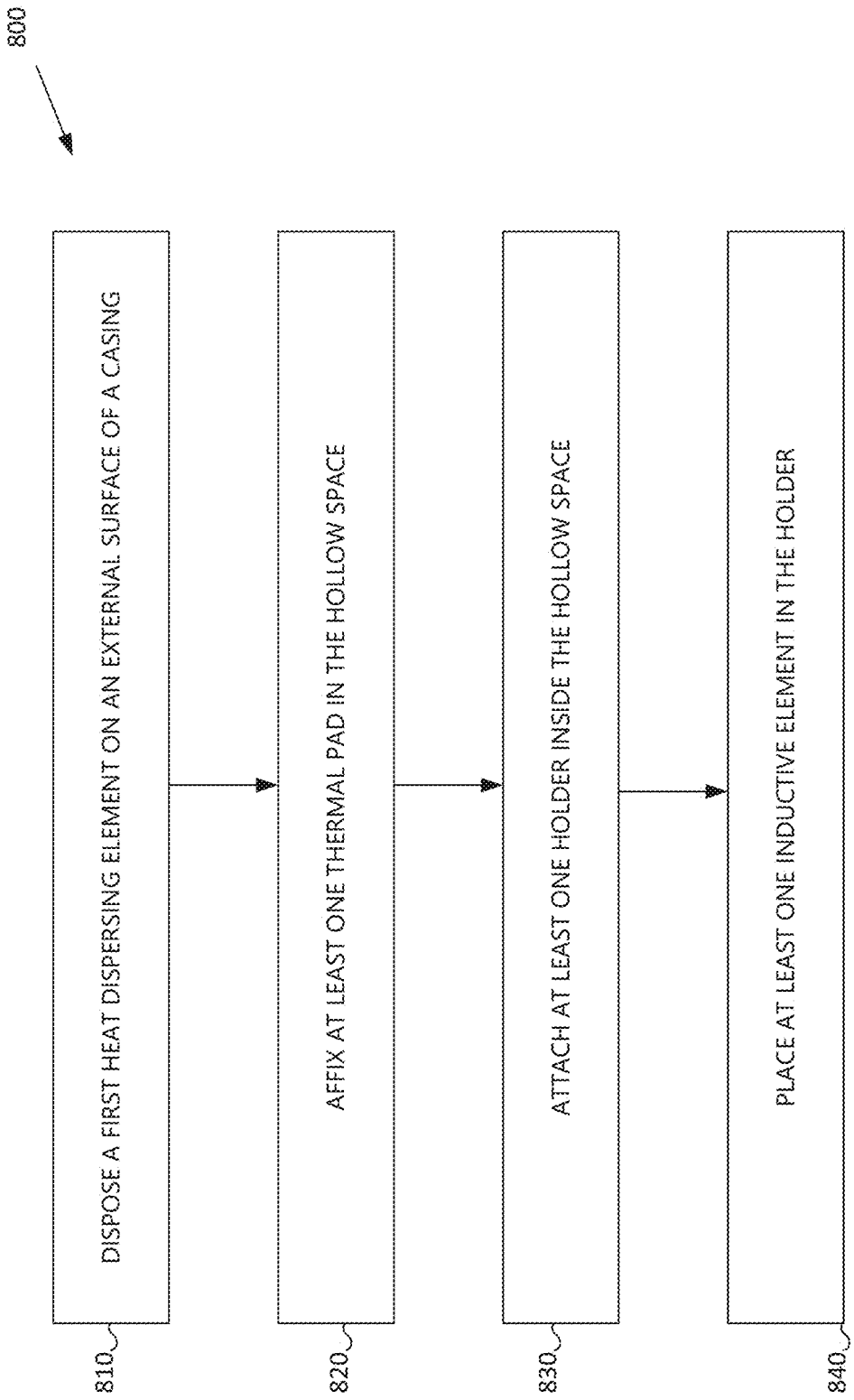
FIG. 8 is a flow diagram showing an example method for assembling a mechanism included in the casing.

Reference is now made to FIG. 8, which is a flow diagram 800 of a method for assembling an apparatus included in the casing. It is appreciated that the particular apparatus described is by way of example, and not to be understood in a limiting fashion. Other apparatuses not described herein below may be placed in the casing described herein or its equivalents.

At step 810, a first heat dispersing element (e.g., a first heat dispersing element 130) may be disposed superficially on an external surface of a casing (e.g., a casing 100). The casing may have a hollow space, such as internal portion 140, formed by an internal surface of the casing. At step 820, at least one thermal pad, such as insulating padding 210, may be affixed in the hollow space. At step 830 at least one holder, such as holder 220, may be attached inside the hollow space. Each holder of the at least one holder may be operative to hold at least one inductive element, such as inductive element 310 or inductive element 340. At step 840, at least one inductive element may be placed in the holder. The holder may be disposed such that one inductive element of the at least one inductive element is disposed over at least one of the at least one thermal pad. The casing may be configured to be disposed in a superstructure comprising a second heat dispersing element disposed superficially on an external surface of the superstructure.

Figure 9:
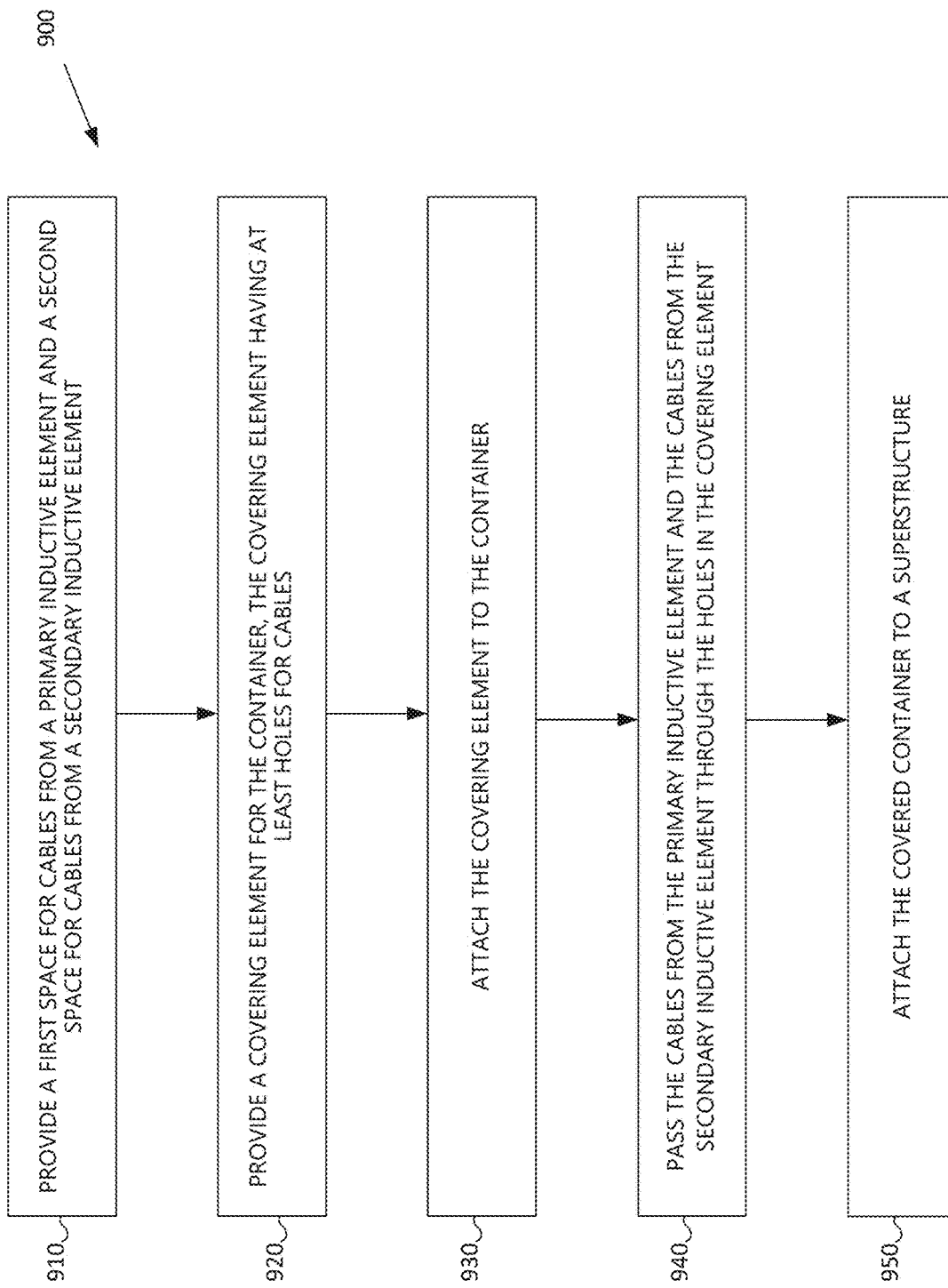
FIG. 9 is a flow diagram showing an example method for attaching the container of a casing to the superstructure.

Reference is now made to FIG. 9, which is a flow diagram showing an example method for attaching a container (e.g., the container of FIG. 1) to the superstructure. It is appreciated that FIG. 9 may be application specific, and other appropriate methods or individual steps may be performed instead of the steps of FIG. 9 as appropriate. The steps of FIG. 9 may be performed in a different order (e.g., as may be appropriate to a particular application or implementation).

At step 910, in a container (e.g., a container 100), a first space may be provided for cables from a primary inductive element (e.g., an inductive element 310), and a second space may be provided for cables from a secondary inductive element (e.g., an inductive element 340). At step 920, a covering element (e.g., a covering element 510) may be provided for the container, and the covering element may have at least holes for cables (e.g., holes 550A). At step 930, the covering element may be attached to the container. At step 940, the cables from the primary inductive element and the cables from the secondary inductive element may be passed through the holes in the covering element. At step 950, the covered container may be attached to the superstructure.

Although examples are described above, features and/or steps of those examples may be combined, divided, omitted, rearranged, revised, and/or augmented in any desired manner. For example, step 940 may be performed before step 930. Various alterations, modifications, and improvements will readily occur to those skilled in the art. Such alterations, modifications, and improvements are intended to be part of this description, though not expressly stated herein, and are intended to be within the spirit and scope of the disclosure. Accordingly, the foregoing description is by way of example only, and is not limiting.

The invention claimed is:

1. An apparatus comprising:
a superstructure;
a casing comprising a first heat dispersing element disposed on an external surface of the casing, wherein the casing comprises a cavity formed by an internal surface of the casing, and the casing is disposed in the superstructure comprising a second heat dispersing element;
at least one thermal pad disposed in the cavity, the at least one thermal pad being thermally conductive;
at least one inductive element;
at least one holder, wherein the holder holds the at least one inductive element; and
at least one electrically insulating pad, wherein the at least one thermal pad and the at least one electrically insulating pad are disposed between the at least one inductive element and the internal surface of the casing,
wherein the at least one holder holds the at least one inductive element over and in thermal contact with the at least one thermal pad and directs heat generated by the at least one inductive element to the first heat dispersing element.

2. The apparatus of claim 1, wherein the first heat dispersing element comprises fins.

3. The apparatus of claim 1, wherein the second heat dispersing element comprises fins.

4. The apparatus of claim 1, wherein the at least one holder is made of a thermally insulating material.

5. The apparatus of claim 4, wherein the thermally insulating material comprises an insulating plastic.

6. The apparatus of claim 1, wherein the at least one inductive element comprises an inductor coil.

7. The apparatus of claim 1, wherein the at least one inductive element comprises a choke.

8. The apparatus of claim 1, wherein the at least one inductive element comprises a reactor or a transformer.

9. The apparatus of claim 1, wherein the superstructure comprises: a direct current (DC) to alternating current (AC) inverter, an AC to DC converter, or a DC to DC converter.

10. The apparatus of claim 1, comprising a fan disposed within the superstructure.

11. The apparatus of claim 1, wherein the cavity is free of potting.

12. The apparatus of claim 1, wherein the at least one inductive element comprises a first inductive element and a second inductive element.

13. The apparatus of claim 12, wherein the second inductive element comprises a choke.

14. The apparatus of claim 13, wherein the choke comprises a differential choke.

15. A method comprising:
disposing a first heat dispersing element on an external surface of a casing, the casing having a cavity formed by an internal surface of the casing;
disposing the casing in a superstructure;
disposing a second heat dispersing element on an external surface of the superstructure;
affixing at least one thermally conductive pad in the cavity;
attaching at least one holder in the cavity;
placing at least one inductive element in the at least one holder, the at least one holder being disposed such that the at least one inductive element is disposed over and in thermal contact with the at least one thermally conductive pad, wherein the at least one thermally conductive pad directs heat generated by the at least one inductive element to the first heat dispersing element; and
placing at least one electrically insulating pad, wherein the at least one thermally conductive pad and the at least one electrically insulating pad are disposed between the at least one inductive element and the internal surface of the casing.

16. The method of claim 15, wherein the first heat dispersing element or the second heat dispersing element comprises fins.

17. The method of either claim 15, wherein the at least one holder is made of a thermally insulating material.

18. The method of claim 17, wherein the thermally insulating material comprises an insulating plastic.

19. The method of claim 15, wherein the at least one inductive element comprises one or more of: an inductor coil, a choke, a reactor, or a transformer.

20. The method of claim 15, wherein the method further comprises disposing a direct current (DC) to alternating current (AC) inverter, an AC to DC converter, or a DC to DC converter in the superstructure.

* * * * *